(12) United States Patent
Rodriguez

(10) Patent No.: US 9,497,890 B2
(45) Date of Patent: *Nov. 15, 2016

(54) COLD AIR CONTAINMENT SYSTEM IN A DATA CENTRE

(71) Applicant: INTERNATIONAL BUSINESS MACHINES CORPORATION, Armonk, NY (US)

(72) Inventor: Jean-Michel Rodriguez, Montpellier (FR)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/008,757

(22) Filed: Jan. 28, 2016

(65) Prior Publication Data

US 2016/0183412 A1 Jun. 23, 2016

Related U.S. Application Data

(63) Continuation of application No. 13/670,693, filed on Nov. 7, 2012, now Pat. No. 9,313,928, which is a continuation of application No. 13/161,801, filed on Jun. 16, 2011, now Pat. No. 9,332,678.

(30) Foreign Application Priority Data

Sep. 30, 2010 (EP) .................................. 10306067

(51) Int. Cl.
*H05K 5/00* (2006.01)
*H05K 7/20* (2006.01)

(52) U.S. Cl.
CPC ...... *H05K 7/20709* (2013.01); *H05K 7/20172* (2013.01); *H05K 7/20745* (2013.01); *H05K 7/20572* (2013.01)

(58) Field of Classification Search
CPC ..................... H05K 7/20172; H05K 7/20572; H05K 7/20709; H05K 7/20745
USPC ........................................... 454/184; 361/690
See application file for complete search history.

(56) References Cited

U.S. PATENT DOCUMENTS 3,232,333 A 2/1966 Dixon
3,628,626 A 12/1971 Merrill
(Continued)

FOREIGN PATENT DOCUMENTS

EP 2059105 A1 5/2009
GA 2155972 A1 10/1985
(Continued)

OTHER PUBLICATIONS

Sharma, R. et al., "Balance of Power: Dynamic Thermal Management for Internet Data Centers"; Hewlett-Packard Company. Feb. 18, 2003.
(Continued)

*Primary Examiner* — Helena Kosanovic
(74) *Attorney, Agent, or Firm* — Steven Chiu, Esq.; Kevin P. Radigan, Esq.; Heslin Rothenberg Farley & Mesiti P.C.

(57) ABSTRACT

A method is provided for containing cold air in a corridor created on the side of a computer cabinet. The method includes providing a base mountable on the computer cabinet, and providing a panel fastened to the base and moveable with respect to the base, the panel being suitable for separating the cold air in the corridor below the panel from the hot air above the panel.

11 Claims, 3 Drawing Sheets

(56) References Cited

U.S. PATENT DOCUMENTS

| | | |
|---|---|---|
| 3,866,967 A | 2/1975 | Landry et al. |
| 3,977,716 A | 8/1976 | Whited |
| 4,103,957 A | 8/1978 | Landry et al. |
| 4,304,291 A | 12/1981 | Carter |
| 4,840,422 A | 6/1989 | Engel |
| 5,216,579 A | 6/1993 | Basara et al. |
| 5,450,694 A | 9/1995 | Goranson et al. |
| 5,526,228 A | 6/1996 | Dickson et al. |
| 5,813,430 A | 9/1998 | De Leon |
| 5,819,492 A | 10/1998 | Konicek |
| 5,825,620 A | 10/1998 | Chrysler et al. |
| 5,926,368 A | 7/1999 | Chrysler et al. |
| 6,034,870 A | 3/2000 | Osborn et al. |
| 6,104,608 A | 8/2000 | Casinelli et al. |
| 6,412,292 B2 | 7/2002 | Spinazzola et al. |
| 6,481,527 B1 | 11/2002 | French |
| 6,535,382 B2 | 3/2003 | Bishop et al. |
| 6,745,149 B2 | 6/2004 | Beeten |
| 6,775,137 B2 | 8/2004 | Chu et al. |
| 6,819,563 B1 | 11/2004 | Chu et al. |
| 6,859,366 B2 | 2/2005 | Fink |
| 6,927,977 B2 | 8/2005 | Singer |
| 7,046,514 B2 | 5/2006 | Fink et al. |
| 7,104,081 B2 | 9/2006 | Chu et al. |
| 7,259,963 B2 | 8/2007 | Germagian et al. |
| 7,266,964 B2 | 9/2007 | Vogel et al. |
| 7,283,359 B2 | 10/2007 | Bartell et al. |
| 7,334,662 B1 | 2/2008 | Anderl et al. |
| 7,379,298 B2 | 5/2008 | Walsh et al. |
| 7,379,299 B2 | 5/2008 | Walsh et al. |
| 7,382,632 B2 | 6/2008 | Alo et al. |
| 7,385,810 B2 | 6/2008 | Chu et al. |
| 7,400,501 B2 | 7/2008 | Bartell et al. |
| 7,403,391 B2 | 7/2008 | Germagian et al. |
| 7,430,118 B1 | 9/2008 | Noteboom et al. |
| 7,542,287 B2 | 6/2009 | Lewis, II |
| 7,549,917 B2 | 6/2009 | Henry et al. |
| 7,646,603 B2 | 1/2010 | Bard et al. |
| 7,656,660 B2 | 2/2010 | Hoeft et al. |
| 7,667,965 B2 | 2/2010 | Nobile |
| 7,672,128 B2 | 3/2010 | Noteboom et al. |
| 7,800,900 B1 | 9/2010 | Noteboom et al. |
| 7,971,891 B2 | 7/2011 | Kircher |
| 7,986,526 B1 | 7/2011 | Howard et al. |
| 2002/0055329 A1 | 5/2002 | Storck, Jr. et al. |
| 2003/0067745 A1 | 4/2003 | Patel et al. |
| 2003/0155099 A1 | 8/2003 | Montague, Jr. |
| 2003/0155100 A1 | 8/2003 | Montague, Jr. |
| 2004/0217072 A1 | 11/2004 | Bash et al. |
| 2004/0218355 A1 | 11/2004 | Bash et al. |
| 2005/0168942 A1 | 8/2005 | Steinbrecher |
| 2005/0173549 A1 | 8/2005 | Bash et al. |
| 2005/0237716 A1 | 10/2005 | Chu et al. |
| 2006/0139877 A1 | 6/2006 | Germagian et al. |
| 2006/0185931 A1 | 8/2006 | Kawar |
| 2006/0260338 A1 | 11/2006 | VanGilder et al. |
| 2007/0135032 A1 | 6/2007 | Wang |
| 2007/0230124 A1 | 10/2007 | Bartell et al. |
| 2008/0051726 A1 | 2/2008 | Campbell et al. |
| 2008/0144280 A1 | 6/2008 | Walsh et al. |
| 2008/0230305 A1 | 9/2008 | Goto et al. |
| 2008/0257639 A1 | 10/2008 | Yamaguchi et al. |
| 2008/0291626 A1 | 11/2008 | Nelson et al. |
| 2009/0080173 A1 | 3/2009 | Porter et al. |
| 2009/0129000 A1 | 5/2009 | Hoeft |
| 2009/0129015 A1 | 5/2009 | Nobile |
| 2009/0129016 A1 | 5/2009 | Hoeft et al. |
| 2009/0168345 A1 | 7/2009 | Martini |
| 2009/0201640 A1 | 8/2009 | Bard et al. |
| 2009/0277605 A1 | 11/2009 | VanGilder et al. |
| 2010/0061057 A1 | 3/2010 | Dersch et al. |
| 2010/0061059 A1 | 3/2010 | Krietzman et al. |
| 2010/0091448 A1 | 4/2010 | Noteboom et al. |
| 2010/0108272 A1 | 5/2010 | Karidis |
| 2010/0144265 A1 | 6/2010 | Bednarcik et al. |
| 2010/0188816 A1 | 7/2010 | Bean, Jr. et al. |
| 2012/0083197 A1 | 4/2012 | Rodriguez |
| 2013/0062037 A1 | 3/2013 | Rodriguez |

FOREIGN PATENT DOCUMENTS

| | | |
|---|---|---|
| JP | 60189522 A | 9/1985 |
| JP | 2005260148 A | 9/2005 |
| WO | WO9108358 A | 6/1991 |
| WO | WO2009065820 A1 | 5/2009 |

OTHER PUBLICATIONS

"Inter-Rack Flow Seperator to Prevent Computer Rack Hot Exhaust Air Entry Into Cold Region at Rack Inlet of Computer Data Center Facilities", IBM, ip.com, Prior Art Database, ip.com No. IPCOM000137460D, pp. 1-4 (Jun. 20, 2006).

IBM Technical Disclosure Bulletin, "Air-Cooling Scheme Having Enhanced Acoustic Performance," Aug. 1, 1979, NN79081108, vol. 22, Issue 3, pp. 1108-1110.

MailersCo.com, "Heavy Duty Jewel Case Mailer," Jan. 18, 2006, http://web.archive.org/web/20060118031508/www.mailersco.com/cdsleeves.htm.

"Notification of Transmittal of the International Search Report and the Written Opinion of the International Searching Authority, or the Declaration", mailed Mar. 19, 2009, International Application No. PCT/EP2008/065737 (13 pgs.).

Rodriguez, Jean-Michel, First Office Action for U.S. Appl. No. 13/161,801, filed Jun. 16, 2011 (U.S. Patent Publication No. 2012/0083197 Al), dated Sep. 25, 2014 (11 pages).

Rodriguez, Jean-Michel, Second Office Action for U.S. Appl. No. 13/161,801, filed Jun. 16, 2011 (US. Patent Publication No. 2012/0083197 Al), dated May 6, 2015 (10 pages).

Rodriguez, Jean-Michel, Third Office Action for U.S. Appl. No. 13/161,801, filed Jun. 16, 2011 (U.S. Patent 3ublication No. 2012/0083197 Al), dated Aug. 27, 2015 (8 pages).

Rodriguez, Jean-Michel, First Office Action for U.S. Appl. No. 13/670,693, filed Nov. 7, 2012 (U.S. Patent 3ublication No. 2013/0062037 A1), dated Sep. 10, 2015 (11 pages).

COLD AIR CONTAINMENT SYSTEM IN A DATA CENTRE

CROSS-REFERENCE TO RELATED APPLICATIONS

This application is a divisional application of U.S. Ser. No. 13/670,693, entitled "Cold Air Containment System in a Data Centre", filed Nov. 7, 2012, which published Mar. 14, 2013, as U.S. Patent Publication No. 2013/00620037 A1, which is a continuation of U.S. Ser. No. 13/161,801, entitled "Cold Air Containment System in a Data Centre", filed Jun. 16, 2011, which was published on Apr. 5, 2012, as U.S. Patent Publication No. 2012/0083197 A1, and which claims priority from European Patent Application No. 10306067.9, filed Sep. 30, 2010, each of which is hereby incorporated herein by reference in its entirety.

BACKGROUND

One efficient way to cool IT resources is to contain the air in respective corridors. There are two different ways to do the containment: hot corridor containment and cold corridor containment.

Cold corridor containment is more efficient when the cooling is a traditional cooling (air coming from the raised floor with CRACS), which represents a large majority of the cooling systems used today in data centres.

European Application No. EP 2059105 A1, by Gallmann, discloses a constellation of racks that form an aisle between them and all cooling air supply sides of all racks face the aisle. The aisle is covered on top and at both ends against leaking air.

United States Patent Publication No. 2010/0061057 A1, by Dersch et al., discloses an air containment system with a plurality of flexible panel assemblies configured to be arranged in side-to-side relation to form a ceiling.

United States Patent Publication No. 2010/0188816 A1, by Bean et al., discloses an air containment cooling system for containing and cooling air between two rows of equipment racks including a canopy assembly configured to enclose a hot aisle defined by the rows of equipment racks, and a cooling system embedded within the canopy assembly.

Existing systems are complex and it is desirable to have an improved system for containing air in a cold corridor in a data centre.

BRIEF SUMMARY

According to an aspect of the present invention, a method is presented for containing a cold air flow in a corridor of a data centre. The method includes, for instance: providing a base, adapted for being mounted on top of a first cabinet for receiving at least one computer system; and providing a panel, which is attached to the base, wherein the panel can move with respect to the base between a closed position and a deployed position, so that in the closed position, the panel lays on the base, and in the deployed position, the aggregate width of the panel and the base is approximately twice the aggregate width of the panel and the base in the closed position.

In another aspect, a method is provided which includes: providing a cabinet for receiving at least one computer system; and providing a system for containing a cold air flow in a corridor in a data centre mounted on top of the cabinet, wherein the cabinet at least partially forms the corridor. The system includes: a base, adapted for being mounted on top of the cabinet for receiving at least one computer system; and a panel, which is attached to the base, wherein the panel can move with respect to the base between a closed position and a deployed position, so that in the closed position, the panel lays on the base, and in the deployed position, the aggregate width of the panel and the base is approximately twice the aggregate width of the panel and the base in the closed position.

In a further aspect, a method for optimizing configuration of a cold air corridor in a data centre is provided. The data centre includes a plurality of cabinets defining the corridor, and a plurality of systems. The plurality of systems contains cold air flow in the corridor and is mounted on top of respective cabinets of the plurality of cabinets. Each system includes a base, adapted for mounting to the top of a respective cabinet, and a panel attached to the base. The panel reciprocates with respect to the base between a closed position and a deployed position. In the closed position, the panel lays on the base, and in the deployed position, the aggregate width of the panel and the base is approximately twice the aggregate width of the panel and the base in the closed position. Further, actuating means are provided for changing the panel's position between the closed position and the deployed position, and control means are provided for controlling the actuating means to allow a user to choose which panel of the plurality of panels should be moved. The method includes: selecting a layout of the corridor among a set of possible corridor layouts; selecting a width for the corridor; controlling the plurality of systems using the control means so as to configure the corridor according to the layout and the width; measuring the effects of the corridor configuration on the performance of the cooling system; and determining whether the selected layout and width improves performance of the cooling system.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
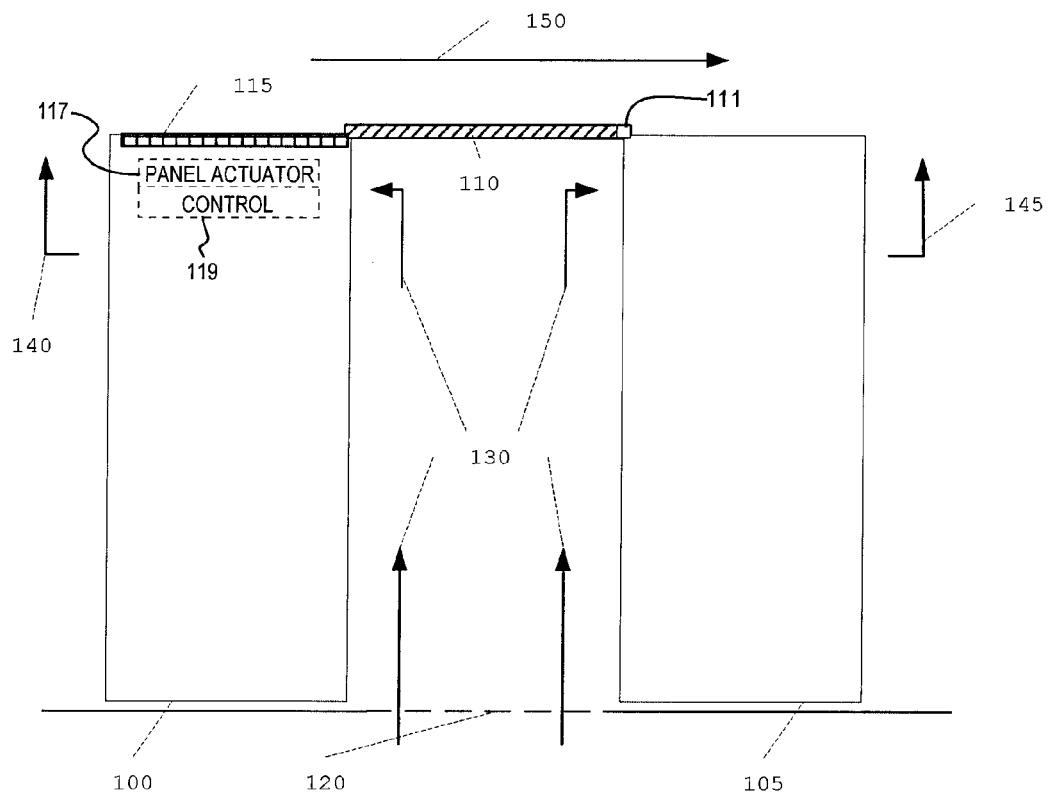
FIG. 1 shows one embodiment of a data centre comprising a system, in accordance with one or more aspects of the present invention.

FIG. 1 shows an arrangement of two cabinets in connection with which aspects of the present invention can be implemented, comprising:

a first cabinet (100);
a second cabinet (105);
a panel (110) on top of the two cabinets; and
a base (115) mounted on top of the first cabinet (100).

The panel (110) is attached to the base (115). The panel (110) is further arranged between the two cabinets so as to form a corridor below the panel and between the sides of the cabinets. Such corridor can be used to contain a cold air flow (130) coming from the raised floor (120) with CRACS. The cold air flow can only go into the cabinet to circulate, thus cooling the computer system mounted in the cabinet (100, 105). The air comes out of the cabinet as hot air (140, 145) and goes up. It then circulates (150) towards a cooling system not represented on the picture. The term cabinet will be preferentially used in the present description. However, some references of the prior art uses the term rack or computer rack instead, whereas a rack is used for mounting computer systems inside a cabinet. It is intended to apply the teachings of the present invention to any systems equivalents to a computer cabinet, including a rack.

In an implementation of the present invention, the panel (110) is attached to a base (115), which is itself attached to first cabinet (100). The base can be mounted, fixed, screwed, glued, nailed or soldered on the cabinet or further attached using any other equivalent techniques for attaching the base to the top of the cabinet (100). The panel functions as a blocking member. It can be flat or concave, corrugated or domed. It can have a rectangular shape, square, or other shape.

In FIG. 1, the panel (110) is represented in a deployed position in contact with a vertical surface, the vertical surface being in FIG. 1 the side of the other cabinet (105) facing the cabinet (100) on top of which an implementation of a system, comprising one or more aspects of the present invention is mounted. When the panel is in the deployed position, and when the base is mounted on the first cabinet and the panel is further in contact with a vertical surface, the panel, the first cabinet and the vertical surface can form a corridor where cold air can flow below the panel and into the first cabinet, and the panel can separate the cold air flow from hot air flow above the panel. In the deployed position, the aggregate width of the panel and the base is approximately twice the width of the aggregate width of the panel and the base in the closed position. The panel (110) can be put in a closed position, not represented in the figure. In the closed position, the panel (110) would lay on the base, on top of the cabinet (100). In this position, the system formed by the cabinet, the base and the panel (110) does not occupy much more space than the cabinet itself. To that end, a panel with dimensions compliant with standard cabinet positions may be used.

To improve efficiency of air containment in the corridor below the panel, the panel can further comprise, on its side opposite to the side attached to the base, means for fastening such side to a surface. Such means can be fabric hook-and-loop fasteners, screws, rivets, latch or any other device which mechanically joins the panel (110) and the surface together. The means for fastening can also rely on magnetic force to join the side of the panel to the surface, as with a magnetic lock. The panel can further comprise a release mechanism for detaching the fastening means, either by a mechanical action, or by suppressing the aforementioned magnetic force. For example, the fastening means on the panel can be an electromagnet, which can form a magnetic lock with an armature plate attached to the surface when an electric current is supplied to the electromagnet. Suppression of the electric current would cause the magnetic force to stop and the magnetic lock to open. There exist many implementations available for mechanical or magnetic fastening means and releasing means which can be used here. To improve efficiency of the system and minimize leaks, the panel can be adapted to sealably engage the base and/or the surface, so as to create an air-tight corridor. However having an air-tight corridor is not a requirement for the system to greatly improve the cooling of computer cabinets.

The panel can be adapted to be fastened to a vertical surface, such as a wall, a horizontal surface, such as the top of the second cabinet (105), or another panel that would be mounted on the second cabinet (105).

Figure 2:
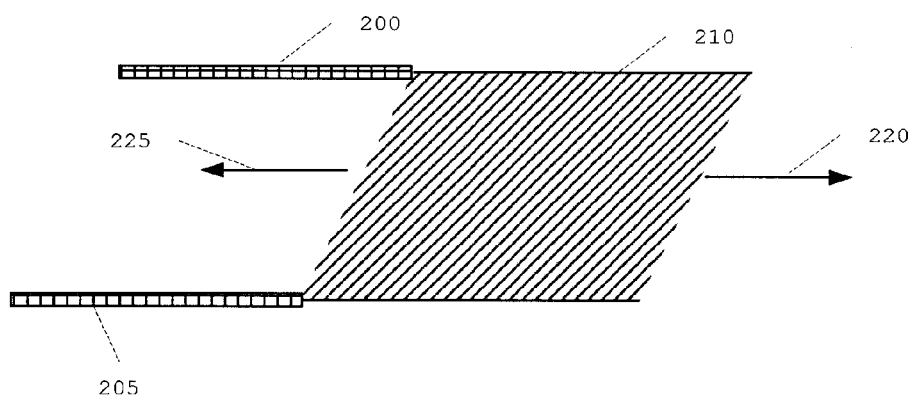
FIG. 2 shows one embodiment of a system where a panel can slide with respective to a base, in accordance with one or more aspects of the present invention.

FIG. 2 shows one embodiment of a system in accordance with one or more aspects of the present invention. In this embodiment of the system, the panel can slide with respect to the base. As illustrated, the system comprises a first rail (200) and a second rail (205) parallel to the first rail, and a panel (210) which can slide in the rails (200, 205) following a direction parallel to the rails (220). The system used for sliding racks can be easily adapted to provide for the rails shown in FIG. 2. The rails (200, 205) can be optionally configured so that the panel (110) can slide from the closed position in the opposite direction (225), thus enabling two deployed positions for the panel. Thus the corridor can be formed on either side of the cabinet on which an implementation of the system is mounted. A system with only one rail could be implemented as well.

Figures 3A, 3B:
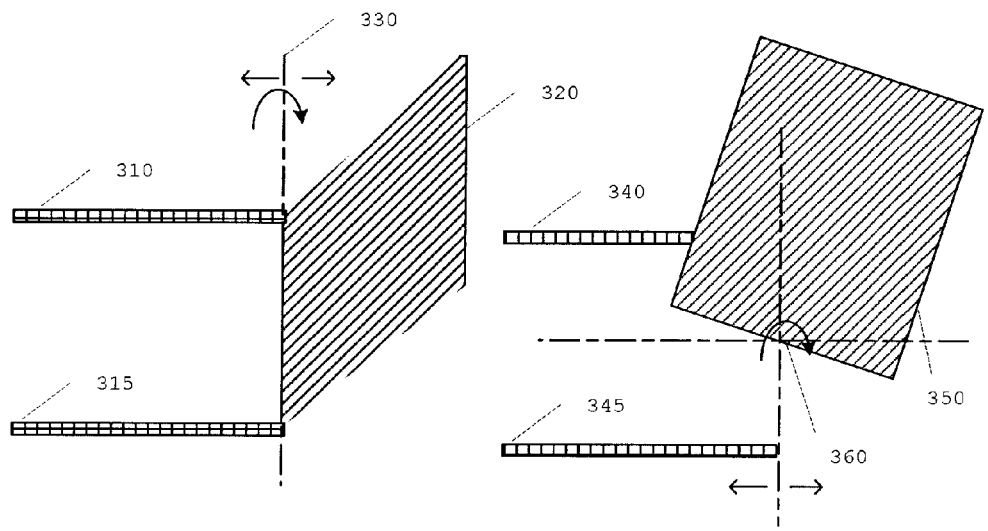
FIGS. 3A & 3B show another embodiment of a system where the panel can rotate with respect to the base around a horizontal or vertical axis, in accordance with one or more aspects of the present invention.

FIGS. 3A & 3B show another embodiment of a system according to one or more aspects of the present invention, wherein the panel can rotate with respect to the base.

In FIG. 3A, the panel (320) can rotate around a horizontal axis (330) and is pivotally mounted on the base (310, 315). The base can have a rectangular shape, or can have two smaller elements (310, 315) as in FIG. 3A. In FIG. 3B, the panel (350) can rotate around a vertical axis (360) and is attached to the base (340, 345) at that point. The base (340, 345) at have the same characteristics as in the description with respect to FIG. 3A. The base can also comprise means for sliding the axis of rotation of the panel in a plane parallel to the base. Sliding the axis makes the axis translate in a linear motion. That would allow the panel to pivot on either side of the base easily.

Figure 4:
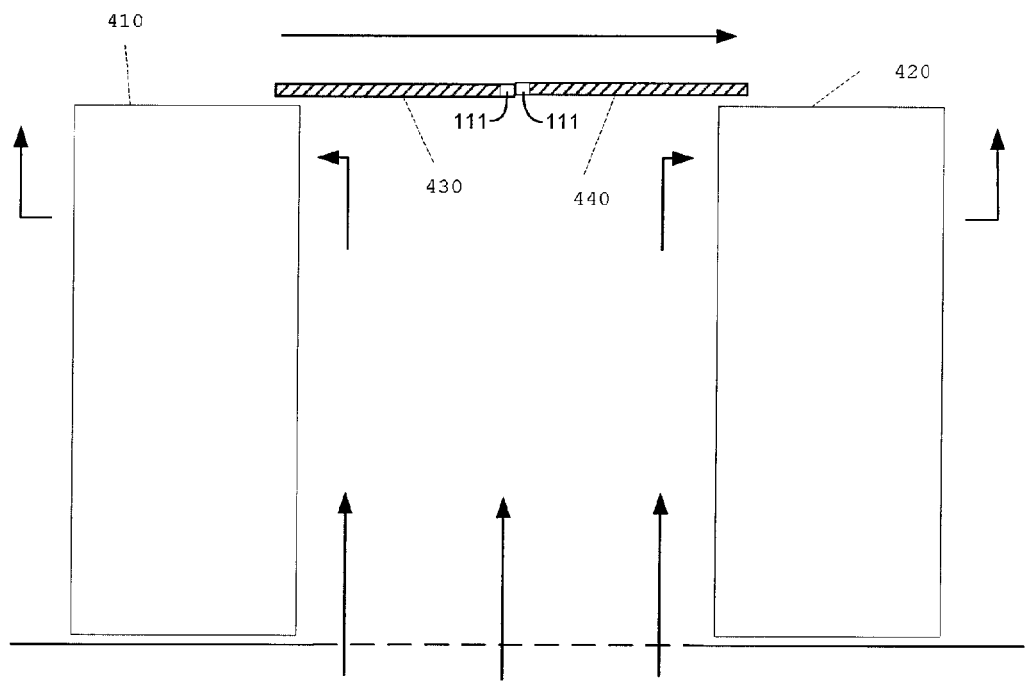
FIG. 4 shows a data centre with an arrangement of two cabinets, each with a system mounted on top thereof, in accordance with one or more aspects of the present invention.

FIG. 4 shows an arrangement of two cabinets, each with an implementation of a system in accordance with one or more aspects of the present invention mounted on top, and comprising:

a first cabinet (410) with a first implementation of the system (430) mounted on top of it; and
a second cabinet (420) with a second implementation of the system (440) mounted on top of it.

The panel of the first implementation can be attached to the panel of the second implementation using fastening means as described with respect to FIG. 1. If the panel rotates with respect to the base, as in FIG. 3A or 3B, fastening means on only one side of the panel can suffice to create that configuration (for example an electromagnet and an armature plate). If the panel can slide both ways as in FIG. 2, fastening means on each side of the panel can be required to create the configuration of FIG. 4. For example, the electromagnet on one side can be arranged to face the armature plate on the other side, and vice versa. Thus the panel can be fastened on either side, including to another panel. If the panel can rotate as in FIGS. 3A & 3B, and its axis of rotation can slide with respect to the base, then fastening means on only one side of the panel are sufficient for the panel to be fastened on either side of the cabinet.

Figure 5:
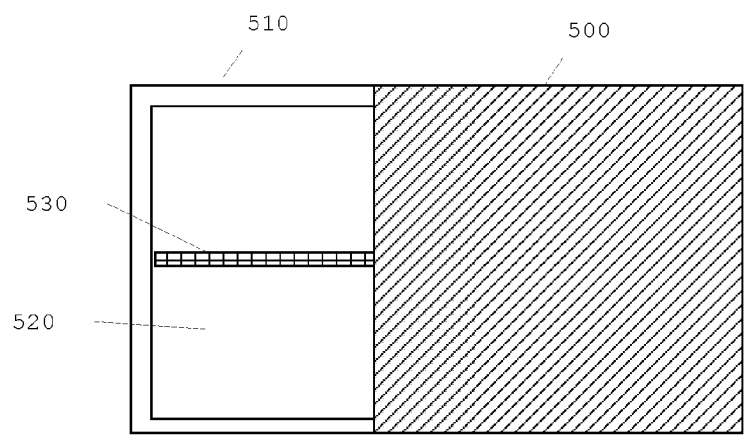
FIG. 5 shows a top plan view of another embodiment of a system, in accordance with one or more aspects of the present invention.

FIG. 5 shows a view from above of a top cover of a cabinet according to an embodiment of a system comprising one or more aspects of the present invention:

the cabinet (510) can receive a computer (520); and the panel (500) can act as the cabinet cover when in the closed position, and, when in the deployed or open position, can leave the cabinet open at its top, so as to create another way for the hot air to come out of the cabinet.

The panel (500) is thus directly mounted on the cabinet, which thus serves as a base. The cabinet can optionally have one or several rails (530) for allowing the panel to slide in any direction parallel to the rail (530). The panel can also be pivotally mounted on the cabinet as described with respect FIGS. 3A & 3B.

Figure 6:
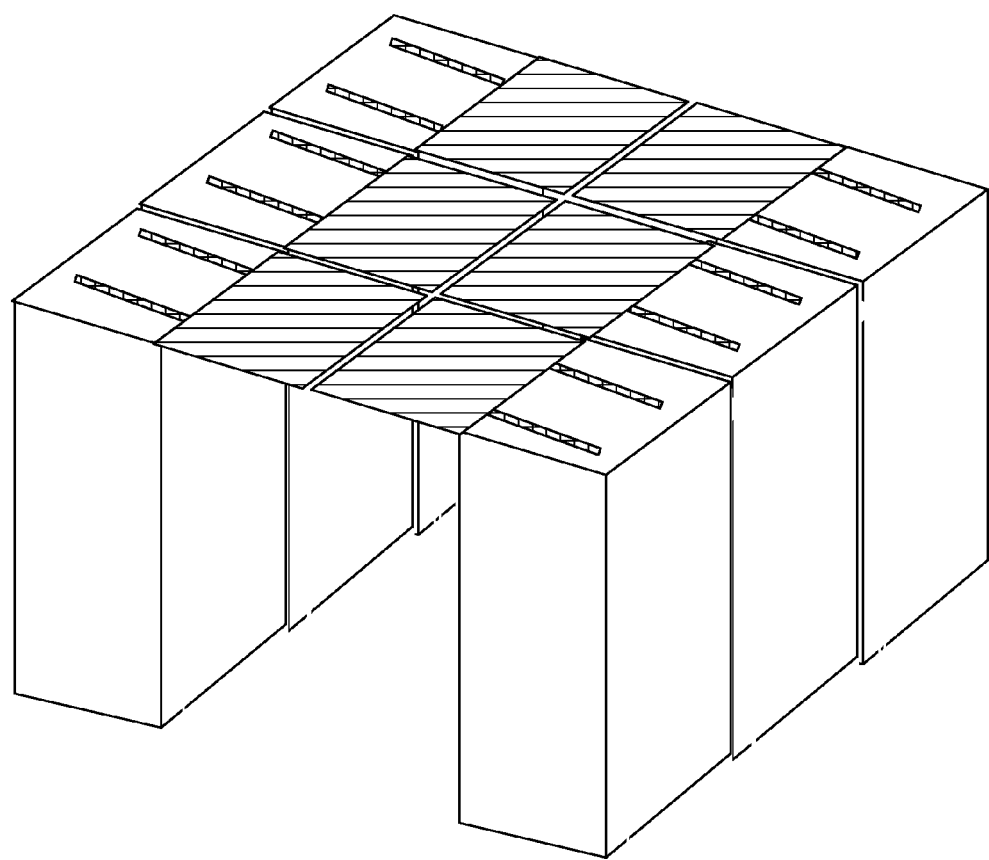
FIG. 6 shows a plurality of cabinets, some of them having one embodiment of a system mounted thereon, in accordance with one or more aspects of the present invention.

FIG. 6 shows a plurality of cabinets having an implementation of a system in accordance with one or more aspects of the present invention, mounted on top. In FIG. 6, the cabinets are aligned to form rows of cabinets. The panels mounted on top of the cabinets can be moved to form a corridor between the two rows. When the panels are in the deployed position, they together form an enclosure which covers most of the corridor thus separating a hot air flow above the enclosure from a cold air flow below the enclosure. Leaks between the two air flows are still possible, but they are minimized by such an enclosure. The cold air flow coming out of the floor below the panel is contained in this corridor and is forced to go through the cabinets so as to cool the computer systems mounted within the cabinets. Each cabinet is, in one embodiment, arranged so that one of its sides, comprising holes for letting air flow, faces the corridor. The width of the cold corridor can thus take values between a very small distance, when the two rows are very close, and up to twice the width of a panel.

In another embodiment of a system in accordance with one or more aspects of the present invention, the system further comprises actuating means, possibly integrated to the base, for making the panel move between the close and the deployed or open position. Such actuating means can be commonly found, either to make the panel slide (a mechanism similar to the ones used in CD player can be used) or to make it rotate (using for example a mechanism used to operate automatic doors). The actuating means can be coupled to remotely activated control means, so that a user can create the corridor when and on the side he wants, without requiring physical access to the panel or to the cabinet. It is further possible to enable such controlling means to be selectively activated, for instance by providing a unique code, corresponding to the controlling means to be activated, at the time when the order for activating the controlling means is issued. This enables configuration of cold air corridors in data centres to be done automatically, possibly controlled by a computer system. This way, it is possible to optimize the cooling of the data centre by searching for the optimal configuration of cold air corridors in the data centre. Such optimization can be done using known techniques such genetic algorithms, simulated annealing or others. Optimization can be done on a layout of corridors, just taking advantage of the ability to choose the side on which the panel is deployed, and on the width of the corridors, potentially all different, thus taking advantage of the ability to configure the extent to which a panel is deployed.

In another embodiment of a system comprising one or more aspects of the present invention, the system for containing cold air in a corridor created on the side of a computer cabinet, comprises a base mountable on the computer cabinet, and a panel fastened to the base and moveable with respect to the base, the panel being suitable for separating the cold air in the corridor below the panel from the hot air above the panel.

Those skilled in the art will note from the above description that, in accordance with a first aspect of the present invention, there is provided a system for containing a cold air flow in a corridor in a data centre, the system comprising a base, adapted for being mounted on top of a first cabinet for receiving at least one computer system, a panel which is attached to the base, wherein the panel can move with respect to the base between a closed position and a deployed position, so that in the closed position, the panel lays on the base, and in the deployed position, the aggregate width of the panel and the base is approximately twice the aggregate width of the panel and the base in the closed position.

An advantage of this aspect is that such a system can easily be operated to create a cold air flow corridor when mounted on a cabinet in a data centre. A further advantage is that when the system is not in use, it can be easily and securely stored by being put in the close position, without taking much more room than the cabinet itself.

In a first development of the first aspect, the panel is fastened to the base along an axis around which the panel can rotate.

An advantage is that the fastening means between the panel and the base can be very robust, and very cheap to make, as such means exist today in a great variety.

In a second development of the first aspect, the panel can slide with respect to the base, in a plan parallel to the base.

An advantage is that the corridor can be formed even if there is little room above the cabinet. A further advantage is that it is easy to make the panel slide on either side of the cabinet.

In a third development of the first aspect, the base comprises two rails in which the panel can slide.

An advantage is that this allows use of existing robust rails and sliding mechanisms. Furthermore, it is easy to put an actuator in such system to make the panel slide in one direction or another.

In a fourth development of the first aspect, the panel can be attached to the panel of another system according to one or more aspects of the present invention.

An advantage is that the width of the corridor thus formed can be larger than the length of the panel.

In a fifth development the first aspect, an embodiment of the present invention further comprises actuating means for changing the panel's position between the close position and the deployed position.

In a sixth development the first aspect, an embodiment of the present invention further comprises means for controlling the actuating means, wherein the means for controlling can be remotely activated.

An advantage is that the corridor for a cold air flow can be formed without having physical access to the panel.

In a seventh development the first aspect, the controlling means can be selectively activated, so as to allow a user to choose which panel among several should be moved.

An advantage is that the formation of cold air flow corridors can be set without entering the data centre. It also allows for automated experiments so as to find the optimal corridor configuration for cooling of a data centre using cold corridors techniques.

According to a second aspect of the present invention, a cabinet is provided for receiving at least one computer system comprising a system mounted on or integrated to its top cover, according to one or more aspects of the present invention.

An advantage is that such a cabinet is easier to use than a regular cabinet, on which implementations of the present invention must be attached.

According to a first development of the second aspect, the top cover serves as the panel, so that when the panel is in the deployed position, the cabinet is open at the top, and when the panel is in the closed position, the cabinet is closed at the top.

An advantage is that hot air can get out of the cabinet by the top in addition to getting out by the side of the cabinet. A further advantage is that less material is required to build a cabinet having the capability of forming a corridor on its side, thus lowering the cost of manufacturing such a cabinet.

According to a third aspect of the present invention, there is provided a method for optimizing a configuration of cold air corridors in a data centre comprising a plurality of systems according to one or more aspects of the present invention, the method comprising: selecting a layout of corridors among a set of possible layouts; selecting a width for each corridor; controlling said systems according to claim 8 in the data centre so as to configure the corridors according to said layout and said width; and measuring the effects of said corridors configuration on the performance of the cooling system; determining whether the selected layout and width improves the performance of the cooling system.

An advantage of this aspect is that performance of the data centre can be further improved very easily and in an automatic manner.

Further advantages of the present invention will become clear to the skilled person upon examination of the drawings and detailed description. It is intended that any additional advantages be incorporated therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method for containing a cold air flow in a corridor in a data center, the method comprising:
   providing a base to mount on top of a first cabinet for receiving at least one computer system;
   providing a panel and attaching the panel to the base, wherein the panel moves with respect to the base between a closed position and a deployed position, so that in the closed position, the panel lays flat on the base on top of the first cabinet, and in the deployed position, the panel extends outward from over the computer cabinet; and
   wherein the attaching comprises fastening the panel to the base along an axis around which the panel can rotate.

2. The method of claim 1, wherein the panel can slide with respect to the base, in a plane parallel to the base.

3. The method of claim 2, wherein the base comprises two rails in which the panel can slide.

4. The method of claim 1, wherein the panel can be attached to the panel of another system for containing the cold air flow in the corridor of the data center.

5. The method of claim 1, further comprising providing actuating means for changing the panel's position between the closed position and the deployed position.

6. The method of claim 5, further comprising providing means for controlling the actuating means, wherein the means for controlling can be remotely activated.

7. The method of claim 6, wherein the controlling means can be selectively activated, so as to allow a user to choose which panel among several should be moved.

8. A method comprising:
   providing a cabinet for receiving at least one computer system; and
   providing a system for containing a cold air flow in a corridor in a data center mounted on top of the cabinet, wherein the cabinet at least partially forms the corridor, the system comprising:
   a base to mount on top of the cabinet for receiving at least one computer system;
   a panel to attach to the base, wherein the panel moves with respect to the base between a closed position and a deployed position, so that in the closed position, the panel lays flat on the base on top of the cabinet, and in the deployed position, the patent extends outward from over the computer cabinet; and
   a fastener fastening the panel to the base along an axis around which the panel can rotate.

9. The method of claim 8, wherein the cabinet comprises a top cover, which serves as the panel, wherein with the panel in the deployed position, the cabinet is open at the top, and with the panel in the closed position, the cabinet is closed at the top.

10. A method for optimizing configuration of a cold air corridor in a data center comprising a plurality of cabinets defining the corridor, the method comprising:
    providing a plurality of systems, the plurality of systems facilitating containing cold air flow in the corridor and being mounted on top of respective cabinets of the plurality of cabinets, each system comprising a base mounted to the top of a respective cabinet, a panel attached to the base, wherein the panel reciprocates with respect to the base between a closed position and a deployed position, so that in the closed position, the panel lays flat on the base, and in the deployed position, the panel extends outward from over the respective cabinet, the panel being attached to the base along an axis around which the panel can rotate;

controlling the plurality of systems to configure the corridor;

measuring the effects of the corridor configuration on the performance of the cooling system; and determining whether the selected layout improves cooling performance.

11. The method of claim 10, wherein the measuring comprises measuring the amount of energy required to maintain the temperature in the data center at a predefined temperature for a predefined duration given predefined external conditions.

\* \* \* \* \*